United States Patent
Chen et al.

(10) Patent No.: US 9,455,328 B1
(45) Date of Patent: Sep. 27, 2016

(54) LOW-TEMPERATURE OXIDE METHOD FOR MANUFACTURING BACKSIDE FIELD STOP LAYER OF INSULATED GATE BIPOLAR TRANSISTOR

(71) Applicant: PFC Device Holdings Limited, Hong Kong (HK)

(72) Inventors: Kuan-Yu Chen, New Taipei (TW); Mei-Ling Chen, New Taipei (TW)

(73) Assignee: PFC DEVICE HOLDINGS LIMITED, Hong Kong (HK)

(*) Notice: Subject to any disclaimer, the term of this patent is extended or adjusted under 35 U.S.C. 154(b) by 0 days.

(21) Appl. No.: 15/046,334

(22) Filed: Feb. 17, 2016

(30) Foreign Application Priority Data

Nov. 23, 2015 (TW) .............................. 104138845 A

(51) Int. Cl.
| | |
|---|---|
| H01L 21/332 | (2006.01) |
| H01L 29/66 | (2006.01) |
| H01L 29/06 | (2006.01) |
| H01L 21/02 | (2006.01) |
| H01L 21/308 | (2006.01) |

(52) U.S. Cl.
CPC ... *H01L 29/66333* (2013.01); *H01L 21/02274* (2013.01); *H01L 21/3086* (2013.01); *H01L 29/0615* (2013.01)

(58) Field of Classification Search
CPC .................. H01L 29/66333; H01L 21/02274; H01L 21/3086; H01L 29/0615
See application file for complete search history.

(56) References Cited

U.S. PATENT DOCUMENTS

| | | | | |
|---|---|---|---|---|
| 6,054,748 A | * | 4/2000 | Tsukuda | ............... H01L 29/0615 257/487 |
| 9,245,950 B2 | * | 1/2016 | Kamijo | ............. H01L 29/66333 |
| 2011/0227152 A1 | * | 9/2011 | Hsu | .................... H01L 29/66143 257/334 |
| 2016/0133733 A1 | * | 5/2016 | Chang | ................. H01L 29/7396 257/139 |

FOREIGN PATENT DOCUMENTS

WO    WO 2015015934 A1 * 2/2015 ....... H01L 29/66068

* cited by examiner

*Primary Examiner* — Bradley K Smith
(74) *Attorney, Agent, or Firm* — Chun-Ming Shih; HDLS IPR Services

(57) ABSTRACT

A low-temperature oxide method is used for manufacturing backside field stop layer of IGBT and first fabricates front elements and front metal layer on a first face of a first conductive type substrate. A multiple-recesses structure is formed on a back side of the first conductive type substrate. Each of the recess in the multiple-recesses structure has first conductive type implanted patterns on exterior sides thereof and the multiple-recesses structure has a first conductive type implanted layer on bottom thereof. A plurality of first conductive type polysilicon layers are deposited into the multiple-recesses structure and respectively corresponding to the first conductive type implanted patterns. A second conductive type impurity layer is formed on the bottom of the first conductive type substrate and laser annealing is conducted to form backside field stop layer for IGBT.

8 Claims, 9 Drawing Sheets

LOW-TEMPERATURE OXIDE METHOD FOR MANUFACTURING BACKSIDE FIELD STOP LAYER OF INSULATED GATE BIPOLAR TRANSISTOR

BACKGROUND OF THE INVENTION

1. Field of the Invention

The present invention relates to a method for manufacturing insulated gate bipolar transistor (IGBT), especially to a low-temperature oxide method for manufacturing backside field stop layer of IGBT.

2. Description of Prior Art

Insulated gate bipolar transistor (IGBT) is a semiconductor device combining the features of metal-oxide-semiconductor field effect transistor (MOSFET) and bipolar junction transistor (BJT). IGBT has the advantages of gate-controlling ability of MOSFET and low turn-on voltage of BJT and is thus extensively used in high voltage and high power applications.

A conventional IGBT, such as a punch through (PT) IGBT, mainly comprises a P+ semiconductor substrate and N− buffer layer arranged thereon. An N epitaxial layer is formed on the N− buffer layer and functions as drain of parasitic MOSFET in the IGBT. Moreover, a gate and an emitter are formed in the N epitaxial layer, and a collector is formed on bottom face of the P+ substrate. The breakdown voltage of the PT IGBT is determined by the P+ substrate and N− buffer layer because a maximum electric field is generated therebetween.

Another conventional IGBT, such as a non-punch through (NPT) IGBT, does not use N− buffer layer. The breakdown voltage is determined by the avalanche mechanism of the N epitaxial (N drift) layer. To increase the breakdown voltage, field stop (FS) IGBT was developed where the N− buffer layer in PT IGBT is replaced by a field stop ion implantation layer. Therefore, the abrupt junction in the PT IGBT is also replaced by a graded (such as a linearly graded) N type profile. The value of the maximum electric field can be advantageously reduced to enhance breakdown voltage.

In the conventional IGBT with field stop layer, the backside field stop layer is needed to be fabricated on backside of the device before forming the front side electrode (generally electrode containing aluminum). The aluminum has melting point around 630 centigrade degree, while the thermal driving-in step after the ion implantation for the field stop layer needs high temperature of 900 centigrade degree, which will damage the aluminum-based electrode. However, in conventional process for IGBT with field stop layer, protection layer is first used to protect the front side of the IGBT semi-finished product, which has not the front side electrode, and then the backside field stop layer is fabricated. Therefore, the manufacture process is complicated.

SUMMARY OF THE INVENTION

It is an object of the present invention to provide a low-temperature oxide method is used for manufacturing backside field stop layer of insulated gate bipolar transistor (IGBT) to simplify the manufacture process.

Accordingly, the present invention provides a low-temperature oxide method for manufacturing backside field stop layer of insulated gate bipolar transistor (IGBT) comprises following steps: (a) providing a first conductive type substrate and forming front side elements of IGBT and front side metal layer of IGBT on a front side of the first conductive type substrate; (b) forming a multiple-recesses structure on a back side of the first conductive type substrate, wherein the multiple-recesses structure having a plurality of recesses and widths of the recesses are gradually reduced along a direction toward the front side of the first conductive type substrate, each of the recesses has first conductive type implanted patterns on exterior sides thereof, the multiple-recesses structure has a first conductive type implanted layer on bottom thereof; (c) depositing a plurality of first conductive type amorphous silicon layers in the multiple-recesses structure, wherein each of the amorphous silicon layers is aligned with corresponding first conductive type implanted patterns; (d) implanting a second conductive type implanted layer or depositing a second conductive type amorphous silicon layer on the bottom of the first conductive type substrate; (e) laser annealing the first conductive type amorphous silicon layers in the multiple-recesses structure to form a plurality of backside field stop layers; and (f) forming a collector metal layer on the back side of the first conductive type substrate.

By the above-mentioned process, the field stop layer is fabricated after the formation of the front side metal layer, thus simplifying manufacture and reducing cost.

Moreover, the method of the present invention can form multiple field stop layers (each with different impurity concentrations), thus increasing breakdown voltage.

BRIEF DESCRIPTION OF DRAWING

One or more embodiments of the present disclosure are illustrated by way of example and not limitation in the figures of the accompanying drawings, in which like references indicate similar elements. These drawings are not necessarily drawn to scale.

DETAILED DESCRIPTION OF THE INVENTION

FIGS. 1 to 16 are sectional views showing the steps of low-temperature oxide method for manufacturing backside field stop layer of insulated gate bipolar transistor (IGBT) according to an embodiment of the present invention. With also reference to FIG. 17, this figure shows the flowchart of low-temperature oxide method for manufacturing backside field stop layer of IGBT according to an embodiment of the present invention. As shown in FIG. 17, the low-temperature oxide method for manufacturing backside field stop layer of IGBT comprises following steps: (S10) providing a first conductive type substrate and forming front side elements of IGBT and front side metal layer of IGBT on a front side of the first conductive type substrate; (S12) forming a multiple-recesses structure on a back side of the first conductive type substrate, wherein the multiple-recesses structure having a plurality of recesses and the widths of the recesses are gradually reduced along a direction toward the front side of the first conductive type substrate, each of the recesses has first conductive type implanted patterns on exterior sides thereof, the multiple-recesses structure has a first conductive type implanted layer on bottom thereof; (S14) depositing a plurality of first conductive type amorphous silicon layers in the multiple-recesses structure and each of the amorphous silicon layers is aligned with corresponding first conductive type implanted patterns; (S16) implanting a second conductive type implanted layer or depositing a second conductive type amorphous silicon layer on the bottom of the first conductive type substrate; (S18) laser annealing the amorphous silicon layers in the multiple-recesses structure to form a plurality of backside field stop layers; and (S20) forming a backside metal layer on the back side of the first conductive type substrate. The more detailed description for the method will be made with reference to FIGS. 1 to 16.

Figure 1:
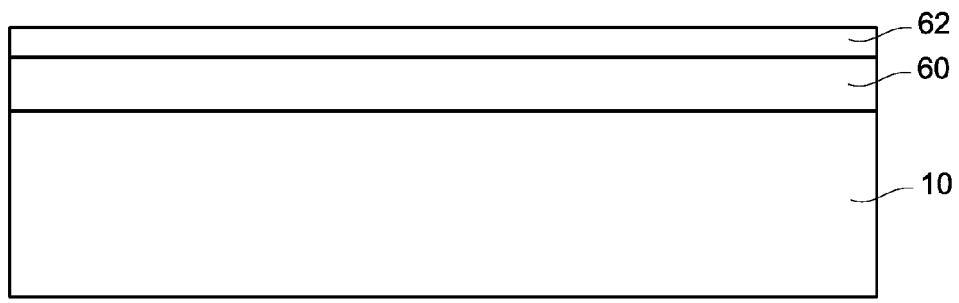
FIGS. 1 to 16 are sectional views showing the steps of low-temperature oxide method for manufacturing backside field stop layer of insulated gate bipolar transistor (IGBT) according to an embodiment of the present invention.
Figure 2:
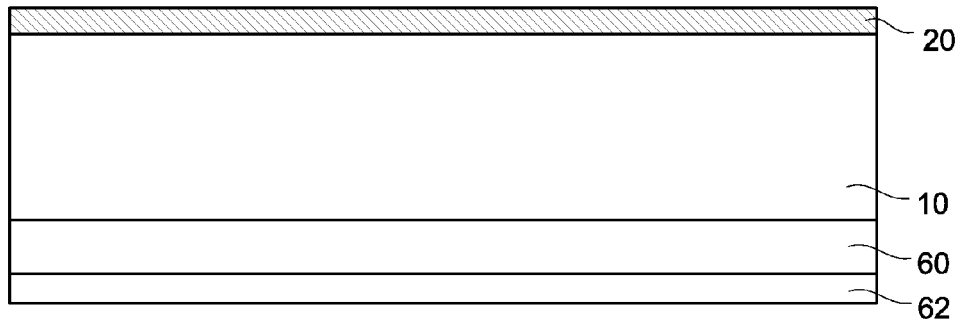

As shown in FIG. 1, an N type (first conductive type) substrate 10 is prepared and front side MOSFET elements 60 and front side metal layer 62 are formed on the N type substrate 10 by conventional process. As shown in FIG. 2, the N type substrate 10 is polished at back side thereof, then stress release wet etching and cleaning are performed for the N type substrate 10 to thin the N type substrate 10 (namely, decrease the thickness of the N type substrate 10). The remaining thickness of the N type substrate 10 is relevant to the demanded voltage tolerance for the IGBT to be manufactured. Afterward, low temperature oxidation (LTO) process such as plasma-enhanced chemical vapor deposition (PECVD) process is conducted to form a low-temperature deposited oxide layer 20 on back side of the N type substrate 10. The processing temperature of the LTO process is below 450 centigrade degree to prevent form damaging the front side metal layer 62.

Figure 3:
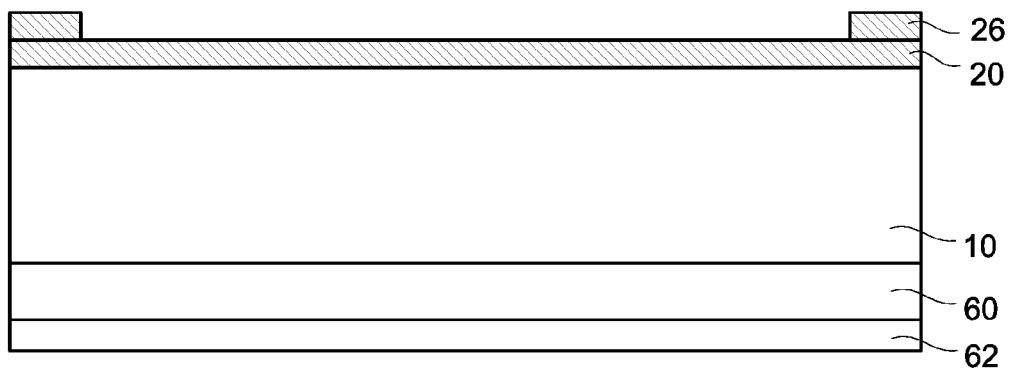

As shown in FIG. 3, photoresist patterns 26 are formed on the low-temperature deposited oxide layer 20 by photolithography process and are used as etching mask such that the portion of the low-temperature deposited oxide layer 20 not covered by the photoresist patterns 26 can be removed in later process.

Figure 4:
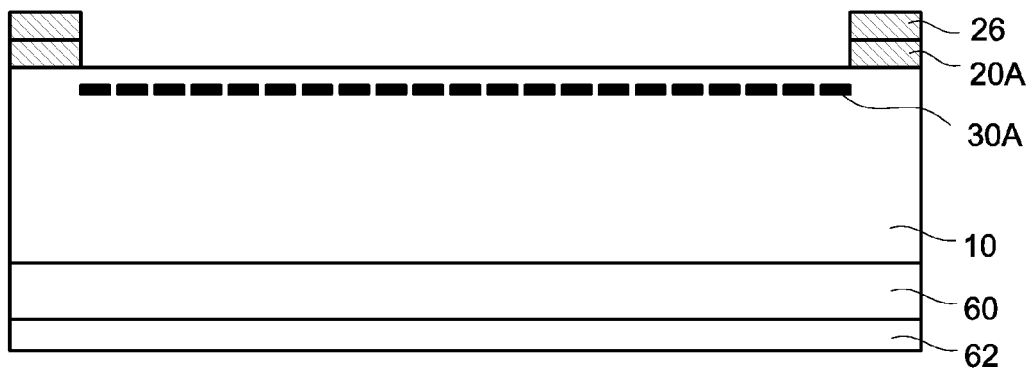
Figure 5:
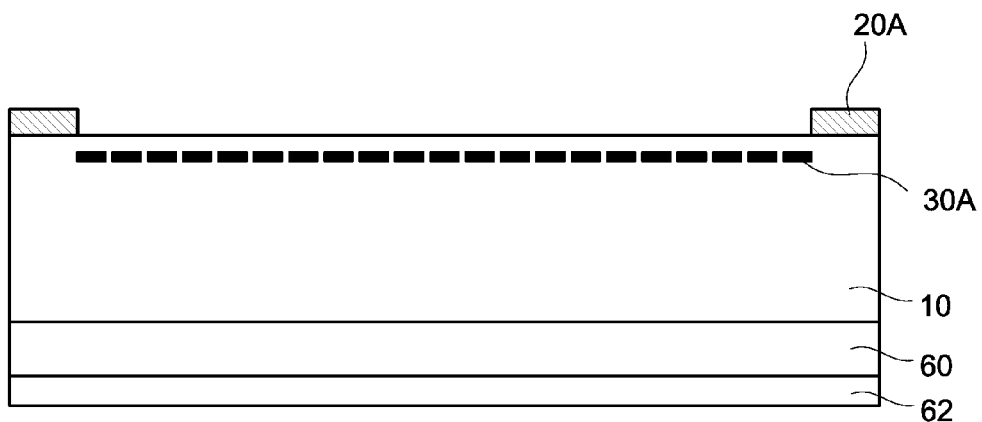
Figure 6:
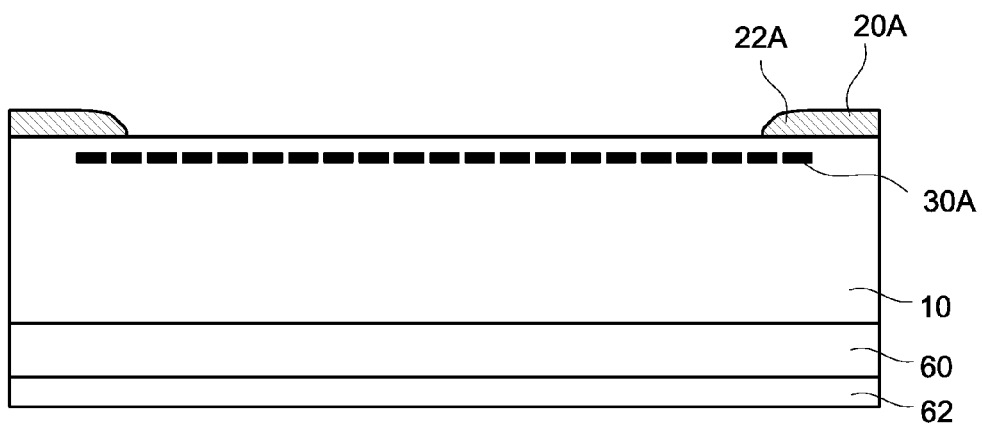

As shown in FIG. 4, non-isotropic (such as dry etching for oxide) can be used with the photoresist patterns 26 as etching mask to remove the portion of the low-temperature deposited oxide layer 20 not covered by the photoresist patterns 26 and only first low-temperature deposited oxide patterns 20A remain. Afterward, the first low-temperature deposited oxide patterns 20A are used as mask for phosphor (P) ion implantation, and N type (first conductive type) first implanted layer 30A is formed on the backside portion of the N type substrate 10, which is not covered by the first low-temperature deposited oxide patterns 20A. The photoresist patterns 26 are then removed (shown in FIG. 5) and the first low-temperature deposited oxide patterns 20A are processed to form first spacers 22A, which block peripheral portion of the N type first implanted layer 30A, as shown in FIG. 6. More particularly, for the formation of the first spacers 22A, low-temperature deposited oxide is grown over the entire surface and then etching (such as isotropic etching) is conducted to form recess as shown in FIG. 6, thus forming the first spacers 22A.

Figure 7:
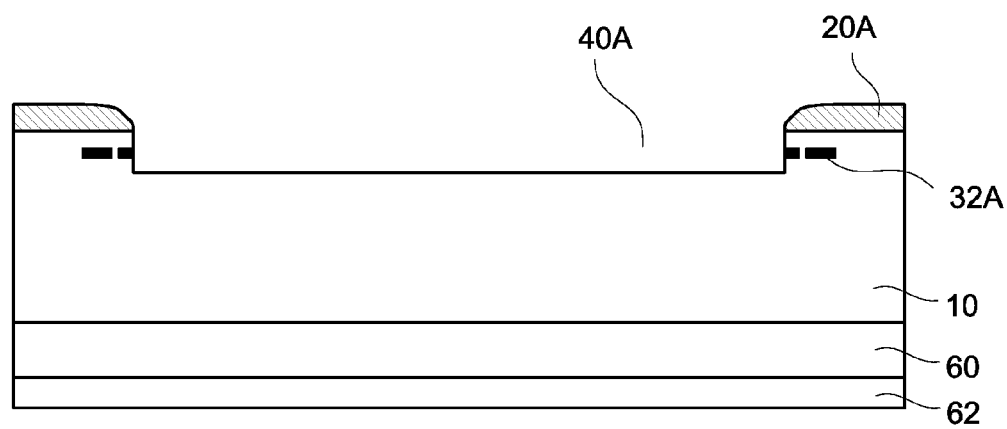

As shown in FIG. 7, the first low-temperature deposited oxide patterns 20A with the first spacers 22A are used as etching mask and the back side of the N type substrate 10 is etched such that the portion not blocked by the first low-temperature deposited oxide patterns 20A with the first spacers 22A is removed to form a first recess 40A. The first recess 40A has such a depth that the portion of the N type first implanted layer 30A (not blocked by the first low-temperature deposited oxide patterns 20A with the first spacers 22A) is removed and therefore the N type (first conductive type) first implanted patterns 32A remains in the resulting structure.

Figure 8:
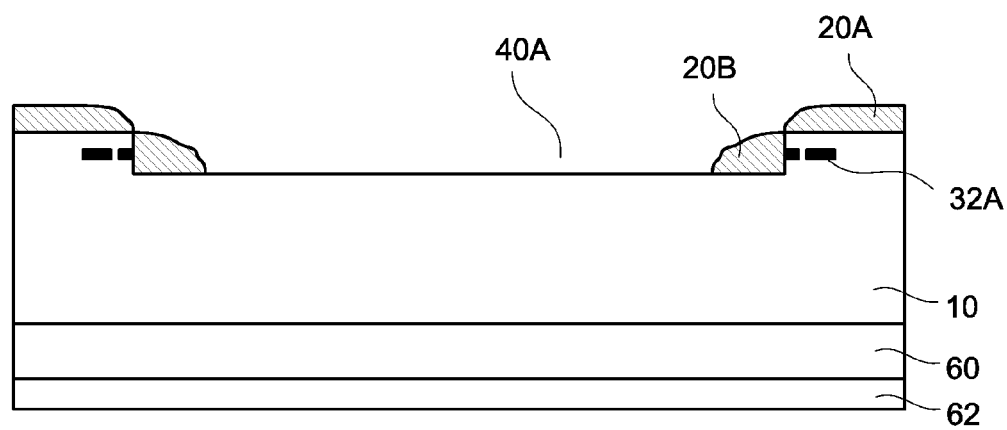
Figure 9:
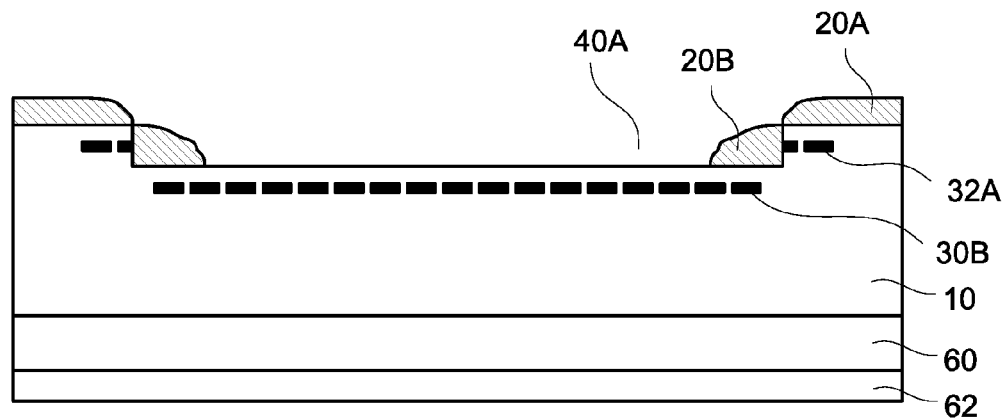
Figure 10:
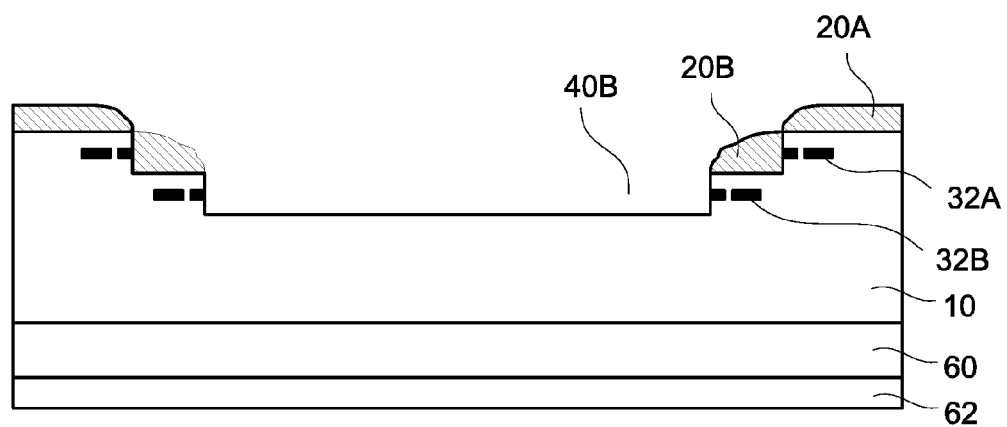

As shown in FIG. 8, second low-temperature deposited oxide patterns 20B are formed on the inner sidewall of the first recess 40A and N type second implanted layer 30B is formed on the backside portion of the N type substrate 10, which is not covered by the first low-temperature deposited oxide patterns 20A and the second low-temperature deposited oxide patterns 20B, as shown in FIG. 9. The second low-temperature deposited oxide patterns 20B is further processed with manner similar to that shown in FIG. 6. Namely, low-temperature deposited oxide is grown over the entire surface and then etching (such as isotropic etching) is conducted to form the spacer (not labelled) for the second low-temperature deposited oxide patterns 20B. The peripheral portions of the N type second implanted layer 30B are blocked by the spacer of the second low-temperature deposited oxide patterns 20B. Afterward, the first low-temperature deposited oxide patterns 20A and the second low-temperature deposited oxide patterns 20B with spacer are used as etching mask to etch the backside of the N type substrate 10 to form a second recess 40B. As shown in FIG. 10, the second recess 40B has such a depth that the portion of the N type second implanted layer 30B not blocked by the first low-temperature deposited oxide patterns 20A and the second low-temperature deposited oxide patterns 20B with spacer is removed, and N type (first conductive type) second implanted patterns 32B remains in the resulting structure.

Figure 11:
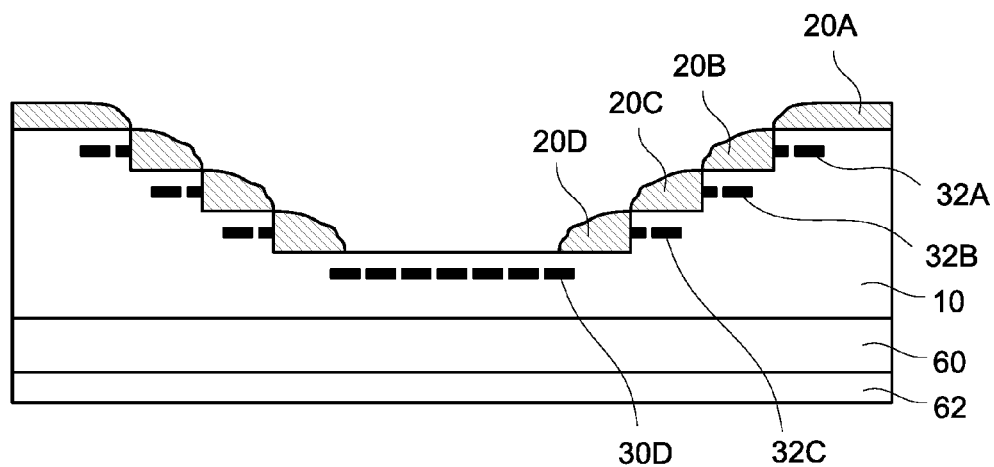

Afterward, steps similar to those shown in FIGS. 8-10 are repeated to form other implanted patterns and implanted layer, namely the N type (first conductive type) third implanted patterns 32C and the N type fourth implanted layer 30D shown in FIG. 11.

Figure 12:
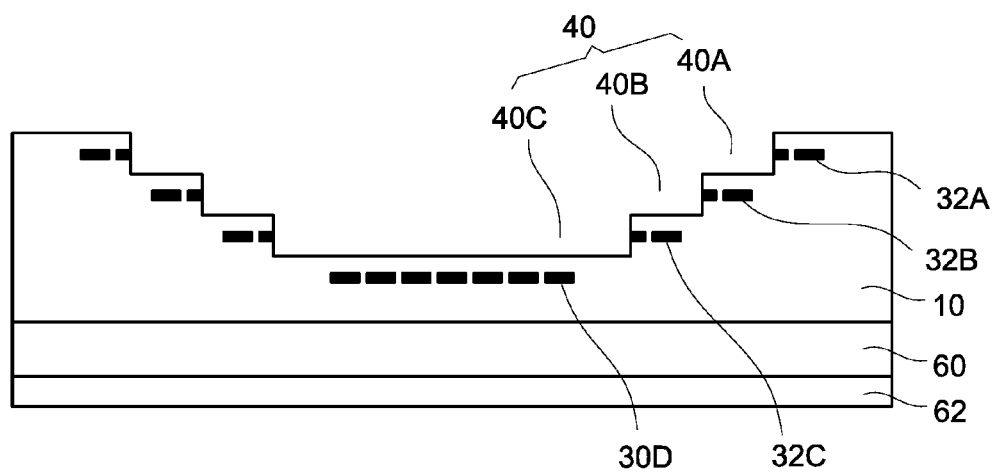

As shown in FIG. 12, etching (such as dry etching or wet etching) is performed to remove the remaining oxide patterns, namely, the first low-temperature deposited oxide patterns 20A, the second low-temperature deposited oxide patterns 20B, the third low-temperature deposited oxide patterns 20C and the fourth low-temperature deposited oxide patterns 20D. The resulting structure shown in FIG. 12 has a multiple-recesses structure 40 including a first recess 40A, a second recess 40B and a third recess 40C. Moreover, the N type (first conductive type) first implanted patterns 32A are present outside the sidewall of the first recess 40A, the N type second implanted patterns 32B are present outside the sidewall of the second recess 40B, the N type third implanted patterns 32C are present outside the sidewall of the third recess 40C, and the N type fourth implanted layer 30D is present on bottom of the third recess 40C.

Figure 13:
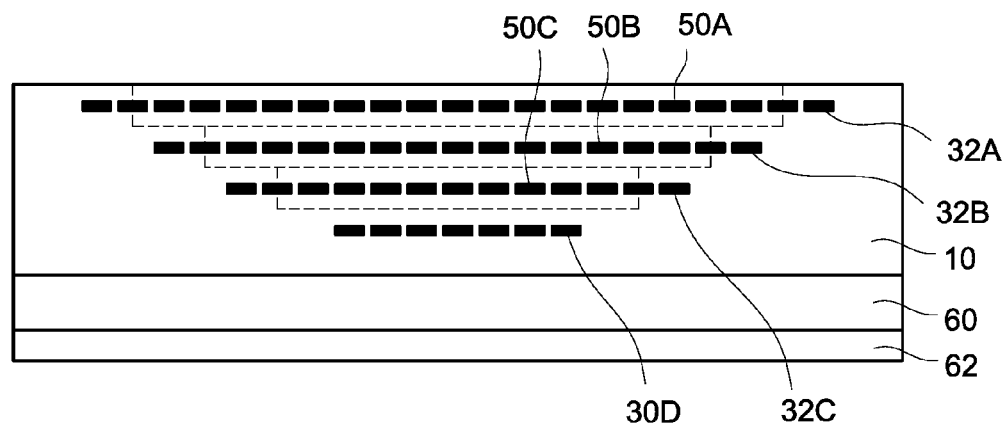

As shown in FIG. 13, a plurality of P-doped amorphous silicon layers made with PECVD process, namely, the first P-doped amorphous silicon layer 50A, the second P-doped amorphous silicon layer 50B and the P-doped amorphous silicon layer 50C. Moreover, the doping concentration of the first P-doped amorphous silicon layer 50A is substantially the same as that of the N type first implanted patterns 32A, the doping concentration of the second P-doped amorphous silicon layer 50B is substantially the same as that of the N type second implanted patterns 32B, and the doping concentration of the third P-doped amorphous silicon layer 50C is substantially the same as that of the N type third implanted patterns 32C.

Figure 14:
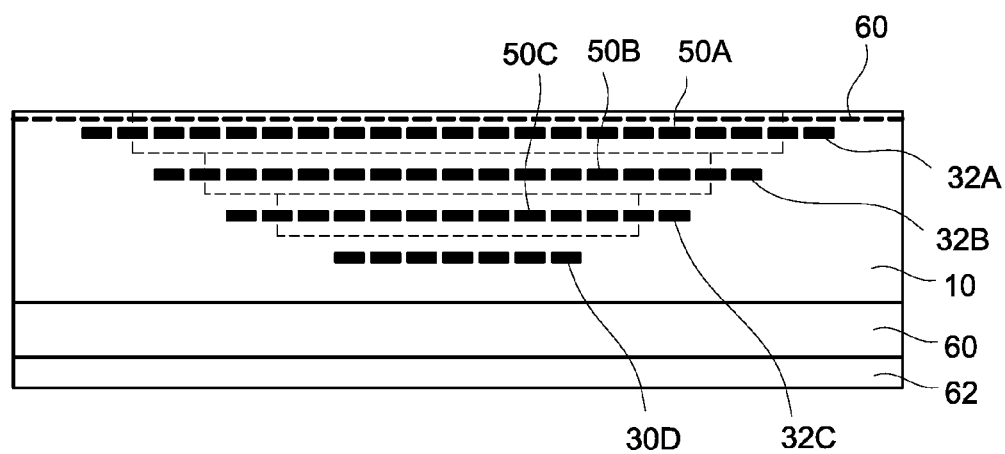

As shown in FIG. 14, after forming the first P-doped amorphous silicon layer 50A, the second P-doped amorphous silicon layer 50B and the P-doped amorphous silicon layer 50C, a boron doped layer 60 is then formed, where the boron doped layer 60 is placed between the N type first implanted patterns 32A and the bottom face of the N type substrate 10. Moreover, the boron doped layer 60 can be a second conductive type amorphous silicon layer 60 made by PECVD or a second conductive type implanted layer 60 made by ion implantation.

Figure 15:
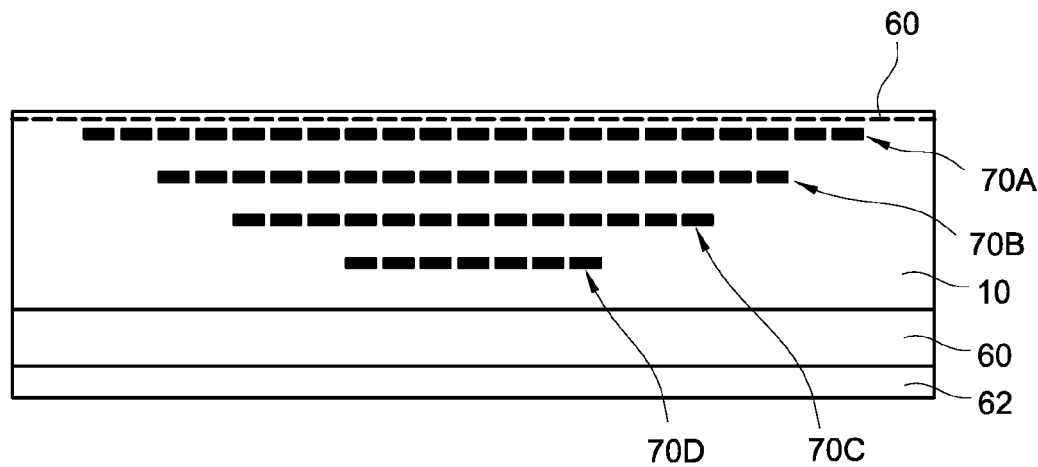

As shown in FIG. 15, the resulting structure is then processed by laser annealing the first P-doped amorphous silicon layer 50A, the second P-doped amorphous silicon layer 50B, the P-doped amorphous silicon layer 50C and the boron doped layer 60. With reference also to FIG. 12, the N type first implanted patterns 32A arranged outside the sidewall of the first recess 40A, the N type second implanted patterns 32B arranged outside the sidewall of the second recess 40B, and the N type third implanted patterns 32C arranged outside the sidewall of the third recess 40C can be used as seed for the first P-doped amorphous silicon layer 50A, the second P-doped amorphous silicon layer 50B, the P-doped amorphous silicon layer 50C. Therefore, the first P-doped amorphous silicon layer 50A, the second P-doped amorphous silicon layer 50B, the P-doped amorphous silicon layer 50C become crystalline after annealing. More particularly, after annealing, the resulting structure has, from bottom of the N type substrate 10 to top of the N type substrate 10, a first field stop layer 70A (including the first P-doped amorphous silicon layer 50A and the N type first implanted patterns 32A), a second field stop layer 70B (including the P-doped amorphous silicon layer 50B and the N type second implanted patterns 32B), a third field stop layer 70C (including the third P-doped amorphous silicon layer 50C and the N type third implanted patterns 32C), and a fourth field stop layer 70D (formed by the N type fourth implanted layer 30D after annealing). Moreover, the IGBT has a boron doped layer 60 between the first field stop layer 70A and the bottom face of the N type substrate 10 to provide a P type semiconductor layer for the IGBT. Moreover, the impurity concentrations of the first field stop layer 70A, the second field stop layer 70B, the third field stop layer 70C and the fourth field stop layer 70D are gradually decreased from the bottom of the N type substrate 10 toward the top of the N type substrate 10. Namely, the first field stop layer 70A has the highest impurity concentration, the second field stop layer 70B has the second highest impurity concentration, the third field stop layer 70C has the third highest impurity concentration and the fourth field stop layer 70D has the lowest impurity concentration. Moreover, the range of the impurity concentrations is between $1\times10^{13}$ cm$^{-3}$ and $1\times10^{16}$ cm$^{-3}$. Namely, the first field stop layer 70A has the highest impurity concentration and its impurity concentration is still below $1\times10^{16}$ cm$^{-3}$; the fourth field stop layer 70D has the lowest impurity concentration and its impurity concentration is still higher than $1\times10^{13}$ cm$^{-3}$ to achieve desired device performance.

Figure 16:
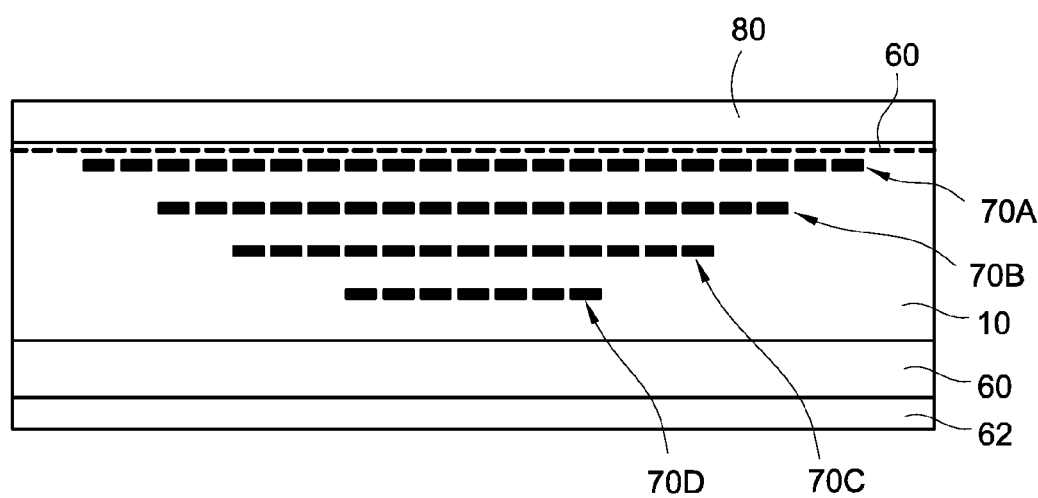
Figure 17:
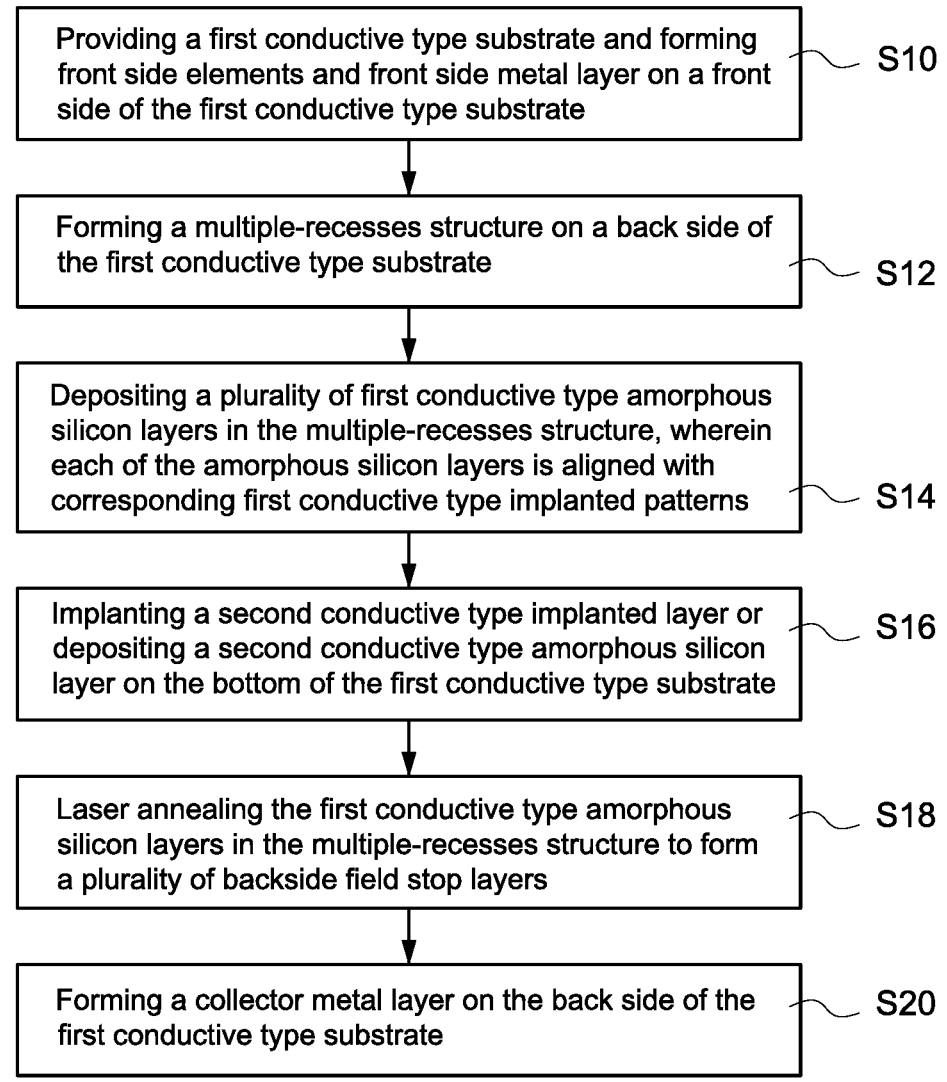
FIG. 17 shows the flowchart of low-temperature oxide method for manufacturing backside field stop layer of IGBT according to an embodiment of the present invention.

As shown in FIG. 16, a backside metal layer is formed on the back side of the N type substrate 10 to function as the collector metal layer 80 of the IGBT. The material of the collector metal layer 80 can be, for example but not limited to, aluminum (Al), TiN or tungsten (W).

By the above-mentioned process, the field stop layer is fabricated after the formation of the front side metal layer, thus simplifying manufacture and reducing cost.

Moreover, the method of the present invention can form multiple field stop layers (each with different impurity concentrations), thus increasing breakdown voltage.

The person skilled in the art can know other implementations are also feasible for above-mentioned embodiment. For example, the N type substrate 10 can be replaced with P type substrate, and correspondingly the N type doping is replaced with P type doping, and vice versa.

Thus, particular embodiments have been described. Other embodiments are within the scope of the following claims. For example, the actions recited in the claims may be performed in a different order and still achieve desirable results.

What is claimed is:

1. A low-temperature oxide method for manufacturing backside field stop layer of insulated gate bipolar transistor (IGBT), the method comprises following steps:
   (a) providing a first conductive type substrate and forming front side elements of IGBT and front side metal layer of IGBT on a front side of the first conductive type substrate;
   (b) forming a multiple-recesses structure on a back side of the first conductive type substrate, wherein the multiple-recesses structure having a plurality of recesses and widths of the recesses are gradually reduced along a direction toward the front side of the first conductive type substrate, each of the recesses has first conductive type implanted patterns on exterior sides thereof, the multiple-recesses structure has a first conductive type implanted layer on bottom thereof;
   (c) depositing a plurality of first conductive type amorphous silicon layers in the multiple-recesses structure, wherein each of the amorphous silicon layers is aligned with corresponding first conductive type implanted patterns;
   (d) implanting a second conductive type implanted layer or depositing a second conductive type amorphous silicon layer on the bottom of the first conductive type substrate;
   (e) laser annealing the first conductive type amorphous silicon layers in the multiple-recesses structure to form a plurality of backside field stop layers; and
   (f) forming a collector metal layer on the back side of the first conductive type substrate.

2. The low-temperature oxide method in claim 1, wherein the step (b) further comprises:
   (b1) defining a recess on the back side of the first conductive type substrate and implanting a first conductive type implanted layer on bottom of the recess;
   (b2) forming a first low-temperature deposited oxide patterns with spacers on the back side of the first conductive type substrate, wherein the spacers of the first low-temperature deposited oxide patterns cover at least a portion of the first conductive type implanted layer;
   (b3) performing etching with the first low-temperature deposited oxide patterns with spacers as etching masks to remove a portion of the first conductive type implanted layer not covered by the spacers such that first conductive type implanted patterns are formed;
   (b4) forming a second low-temperature deposited oxide patterns with spacers on the back side of the first conductive type substrate, wherein the second low-temperature deposited oxide patterns are deeper than the first low-temperature deposited oxide patterns;
   (b5) forming another first conductive type implanted layer below the second low-temperature deposited oxide patterns and etching the another first conductive type implanted layer below with the second low-temperature deposited oxide patterns as etching masks to form another first conductive type implanted patterns;
   (b6) repeating above steps (b4) and (b5) until the multiple-recesses structure and associated first conductive type implanted patterns are finished.

3. The low-temperature oxide method in claim 1, wherein the first conductive type is N type or P type.

4. The low-temperature oxide method in claim 1, wherein the deposition in step (c) is performed by plasma-enhanced chemical vapor deposition (PECVD).

5. The low-temperature oxide method in claim 1, wherein four field stop layers are formed after step (d).

6. The low-temperature oxide method in claim 5, wherein impurity concentrations of the four field stop layers are decreased from a backside of the first conductive type substrate.

7. The low-temperature oxide method in claim 6, wherein a range of the impurity concentrations is between $1\times10^{13}$ cm$^{-3}$ and $1\times10^{16}$ cm$^{-3}$.

8. The low-temperature oxide method in claim 1, wherein material of the collector metal layer is aluminum (Al), TiN or tungsten (W).

\* \* \* \* \*